(12) United States Patent
Yamamoto et al.

(10) Patent No.: US 7,549,344 B2
(45) Date of Patent: Jun. 23, 2009

(54) PRESSURE SENSOR PACKAGE AND ELECTRONIC PART

(75) Inventors: Satoshi Yamamoto, Sakura (JP); Mikio Hashimoto, Sakura (JP); Takanao Suzuki, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/175,245

(22) Filed: Jul. 17, 2008

(65) Prior Publication Data

US 2008/0276713 A1 Nov. 13, 2008

Related U.S. Application Data

(63) Continuation of application No. PCT/JP2007/050801, filed on Jan. 19, 2007.

(30) Foreign Application Priority Data

Jan. 19, 2006 (JP) ............................. 2006-010961
Sep. 21, 2006 (JP) ............................. 2006-256003

(51) Int. Cl.
*G01L 9/00* (2006.01)
(52) U.S. Cl. ........................................ 73/754; 257/678
(58) Field of Classification Search .................. 73/754, 73/723, 721, 727; 257/678
See application file for complete search history.

(56) References Cited

U.S. PATENT DOCUMENTS

| | | | |
|---|---|---|---|
| 6,591,689 B2 | 7/2003 | Nidan et al. | |
| 6,809,421 B1 * | 10/2004 | Hayasaka et al. | ............ 257/777 |
| 7,459,777 B2 * | 12/2008 | Nakamura | ................... 257/686 |
| 2004/0137661 A1 * | 7/2004 | Murayama | ................... 438/106 |
| 2006/0185437 A1 | 8/2006 | Sato et al. | |
| 2006/0263988 A1 * | 11/2006 | Takahashi et al. | ........... 438/286 |
| 2007/0216001 A1 * | 9/2007 | Nakamura | ................... 257/678 |
| 2008/0061424 A1 * | 3/2008 | Murayama et al. | .......... 257/690 |

FOREIGN PATENT DOCUMENTS

| | | |
|---|---|---|
| JP | 04095740 A1 | 3/1992 |
| JP | 2001-144276 A | 5/2001 |

(Continued)

OTHER PUBLICATIONS

S. Armbruster et al., "A Novel Micromachining Process for the Fabrication of Monocrystalline SI-Membranes Using Porous Silicon", Digest of Technical Papers Transducers, Mar. 2003, pp. 246-249.

*Primary Examiner*—Andre J Allen
(74) *Attorney, Agent, or Firm*—Sughrue Mion, PLLC

(57) ABSTRACT

A pressure sensor package of the present invention includes a pressure sensor including a cavity disposed within a semiconductor substrate, wherein a region of the substrate above the cavity comprises a diaphragm section; a plurality of pressure-sensitive elements, wherein at least of portion of each pressure-sensitive element is disposed on the diaphragm section; and a plurality of conductive portions laterally spaced from the cavity and electrically connected to the pressure sensitive elements, a plurality of electrically conductive bumps arranged on the conductive portions and electrically connected to the conductive portions, wherein a total thickness D1 of the semiconductor substrate, a thickness D2 of the diaphragm section, a thickness D3 of the cavity, and a thickness D4=D1−(D2+D3) satisfy the relationships: (D2+D3) in a range of approximately 5-20 μm, and D1 not less than about 100 μm.

18 Claims, 21 Drawing Sheets

FOREIGN PATENT DOCUMENTS

| | | |
|---|---|---|
| JP | 2002082009 A1 | 3/2002 |
| JP | 2002-158362 A | 5/2002 |
| JP | 2002340714 A | 11/2002 |
| JP | 2004170148 A | 6/2004 |
| JP | 2006105624 A | 4/2006 |
| WO | 2004068096 A1 | 8/2004 |

* cited by examiner (200 μm)

(200 μm)

(100 μm)

71

88

(100 μm)

88

PRESSURE SENSOR PACKAGE AND ELECTRONIC PART

CROSS-REFERENCE TO RELATED APPLICATIONS

This is a continuation of PCT application no. PCT/JP2007/050801 filed Jan. 19, 2007 which claims priority from Japanese Patent Application No. 2006-010961 filed on Jan. 19, 2006, and Japanese Patent Application No. 2006-256003 filed on Sep. 21, 2006, the disclosures of which are incorporated herein by reference.

BACKGROUND OF THE INVENTION

1. Field of the Invention

Apparatuses and methods consistent with the present invention relate to a pressure sensor package and an electronic part, and more specifically to a compact, low-cost pressure sensor package and a lightweight electronic part on which the pressure sensor package is mounted.

2. Description of the Related Art

An exemplary pressure sensor with a semiconductor substrate (hereinafter, referred to as a "semiconductor pressure sensor") is shown in FIG. 11. A semiconductor pressure sensor 100 includes a thin diaphragm section 102 and four gauge resistance elements 103. The thin diaphragm section 102 is formed by etching from a back surface of a semiconductor substrate 101. The gauge resistance elements 103 are formed on a front surface of the semiconductor substrate 101. The gauge resistance elements 103 are electrically connected to one another so as to form a Wheatstone bridge. When the diaphragm section 102 is bent under pressure, stress in response to the amount of bending of the diaphragm section 102 is applied to each gauge resistance element 103. The resistance value of the gauge resistance element 103 changes due to the stress. The semiconductor pressure sensor 100 detects pressure by detecting and picking up the change in the resistance value as electric signals (see FIG. 5 of Japanese Unexamined Patent Application No. 2002-340714).

The semiconductor pressure sensor is packaged as shown in FIG. 12 for normal use. A pressure sensor package 200 essentially includes a casing 204 which consists of a base 201 of an insulating material, and a resin cover 203. The cover 203 includes a pressure inlet 202. Inside the casing 204, a pressure sensor 205 (100) is disposed on the base 201 and is electrically connected to a lead 207 via a bonding wire 206. In this structure, the pressure sensor 205 (100), as a component of the pressure sensor package 200, may be connected to an external amplifier circuit or compensating circuit (not shown) via the lead 207.

SUMMARY OF THE INVENTION

Related art pressure sensor packages have at least the following two problems.

(1) In a package having a pressure sensor disposed inside the case, even if the pressure sensor can be made smaller, it is difficult to make the entire package compact unless the casing is also made smaller.

(2) In order to produce a package having the structure described above, the process requires providing multiple pressure sensors on a semiconductor substrate, cutting the substrate into chips with a pressure sensor, and then packaging each chip. The related art process requires a large number of processes at a high cost. Thus, it is difficult to manufacture the pressure sensor package at a lower cost.

Exemplary apparatuses and methods consistent with the invention provide a compact, low-cost pressure sensor package by devising a wafer level package which serves as a pressure sensor. Exemplary apparatuses and methods consistent with the invention also provide a compact, lightweight electronic part on which the pressure sensor package is mounted.

A first aspect of the invention is a pressure sensor package which includes a pressure sensor including a cavity disposed within a semiconductor substrate, wherein a region of the substrate above the cavity comprises a diaphragm section; a plurality of pressure-sensitive elements, wherein at least of portion of each pressure-sensitive element is disposed on the diaphragm section; and a plurality of conductive portions laterally spaced from the cavity and electrically connected to the pressure sensitive elements; a plurality of electrically conductive bumps arranged on the conductive portions and electrically connected to the conductive portions, wherein a total thickness D1 of the semiconductor substrate, a thickness D2 of the diaphragm section, a thickness D3 of the cavity, and a thickness D4=D1−(D2+D3) satisfy the relationships: (D2+D3) in a range of approximately 5-20 μm, and D1 not less than about 100 μm.

A second aspect of the invention is a pressure sensor package which includes a pressure sensor including a cavity disposed within a semiconductor substrate wherein a region of the substrate above the cavity comprises a diaphragm section; a plurality of pressure-sensitive elements, wherein at least of portion of each pressure-sensitive element is disposed on the diaphragm section; and a plurality of first conductive portions laterally spaced from the cavity and electrically connected to the pressure sensitive elements; a first insulating section covering a peripheral region of the semiconductor substrate; a plurality of second conductive portions disposed on the first insulating section and electrically connected to the first conductive portions; and a plurality of electrically conductive bumps disposed on the second conductive portions and electrically connected to the second conductive portions at positions not overlapping with the first conductive portions, wherein a total thickness D1 of the semiconductor substrate, a thickness D2 of the diaphragm section, a thickness D3 of the cavity, and a thickness D4=D1−(D2+D3) satisfy the relationships: (D2+D3) in a range of approximately 5-20 μm, and D1 not less than about 100 μm.

A third aspect of the invention further includes, in the second aspect, a second insulating section covering the peripheral region of the semiconductor substrate including the second conductive portions exposing only the electrically conductive bumps.

A fourth aspect of the invention further includes, in the second aspect, a second insulating section overlapping with the first insulating section and covering the second conductive portions exposing only the electrically conductive bumps, wherein the second insulating sections form islands around the electrically conductive bumps and cover the second conductive portions.

A fifth aspect of the invention is characterized in that the electrically conductive bumps are symmetrically positioned with respect to one another, in the second aspect.

A sixth aspect of the invention further includes, in any one of the first and second aspects, an amplifier circuit and/or a compensating circuit inside the semiconductor substrate.

A seventh aspect of the invention is characterized in that, in the second aspect, the first insulating section is formed in an island shape.

An electronic part according to the invention includes the pressure sensor package of any one of the first and second aspects mounted thereon.

In the pressure sensor package according to the first aspect of the invention (hereinafter, referred to as a "first pressure sensor package"), the pressure sensor itself has the diaphragm section and the first conductive section separately on the same semiconductor substrate. The first conductive section is electrically connected to the pressure sensitive element and has the first bump arranged thereon. The dimensions D2 to D4 at the central region at which the diaphragm section is disposed and the dimension D1 of the peripheral region at which the first conductive section is disposed to satisfy the relationships: (D2+D3)<<D4, and D1 being nearly equal to D4. That is, the first pressure sensor is produced from a semiconductor substrate whose material is the same at the central region having the diaphragm section overlapping therewith and at the peripheral region. The thickness of the semiconductor substrate is substantially the same at the central region and the peripheral region. Such a structure has an advantageous effect to suppress the mechanical or thermal influence exerted on the diaphragm section and the pressure sensitive element when the pressure sensor is connected to an external substrate via the first bump. In addition, such a structure in which the pressure sensor is connected to the external substrate via the first bump eliminates the need of a conventionally-required casing for containing the pressure sensor, or connecting elements such as bonding wires and leads for electrically connecting the pressure sensor and the external substrate. Accordingly, the invention provides a compact, low-cost pressure sensor package which requires no casing.

In the pressure sensor package according to the second aspect of the invention (hereinafter, referred to as a "second pressure sensor package"), the pressure sensor itself has the diaphragm section and the first conductive section on the same semiconductor substrate. The first conductive section is electrically connected to the pressure sensitive element and also electrically connected to the second conductive section having the second bump arranged thereon. The dimensions T2 to T4 at the central region at which the diaphragm section is disposed and the dimension T1 of the peripheral region at which the first conductive section and the second conductive section are disposed satisfy the relationships: (T2+T3)<<T4 and T1 being nearly equal to T4. That is, the first pressure sensor is produced from a semiconductor substrate whose material is the same at the central region having the diaphragm section overlapping therewith and at the peripheral region. The thickness of the semiconductor substrate is substantially the same at the central region and the peripheral region. In this structure with the second conductive section, the second bump can be arranged at any position in the peripheral region so as not to overlap with the first conductive section. As a result, connection sites can be selected with a high degree of freedom to meet the demand of the external substrate. Such a structure has an advantageous effect to suppress the mechanical or thermal influence exerted on the diaphragm section and the pressure sensitive element when the pressure sensor is connected to an external substrate via the first bump. In addition, such a structure in which the pressure sensor is connected to the external substrate via the first bump eliminates the need of a conventionally-required casing for containing the pressure sensor, or connecting elements such as bonding wires and leads for electrically connecting the pressure sensor and the external substrate. Accordingly, the invention provides a compact, low-cost pressure sensor package which has a degree of freedom to meet the demand of the external substrate and requires no casing.

The electronic part according to the invention includes a pressure sensor package having the above-described structure mounted thereon. Since the pressure sensor package requires no bulky casing, it requires a substantially smaller area for installing, and is lighter by the weight of the casing. Accordingly, the invention provides a compact, lightweight electronic part.

Above and other objects, operations and advantageous effects of the invention will become apparent to those skilled in the art from the description and drawings of the embodiments of the invention.

DESCRIPTION OF REFERENCE NUMERALS

Figure 1A:
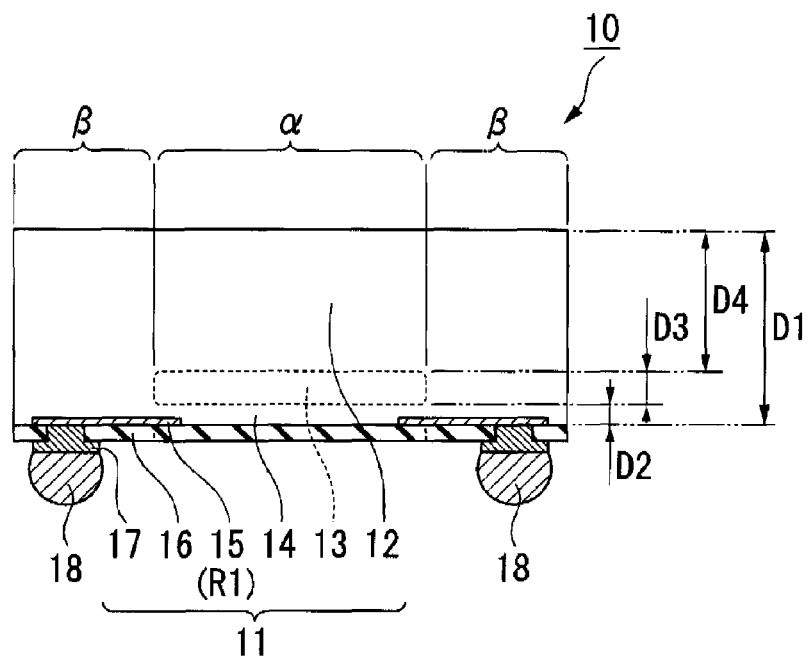
FIG. 1A is a side cross-sectional view of a main part of a pressure sensor package of a first exemplary embodiment of the invention.

α, γ: central region
β, δ: peripheral region
10, 20, 40: pressure sensor module
11, 21: pressure sensor
12, 22: semiconductor substrate
13, 23: reference pressure cavity
14, 24: diaphragm section
15, 25: pressure sensitive element
16, 26: insulating section
17, 27: first conductive sections
18: first bump
28: first insulating section
29: second conductive sections
30: second bump
31: second insulating section
62: circuit 5: lamp

DETAILED DESCRIPTION OF THE EXEMPLARY EMBODIMENTS

Referring now to the drawings, the invention will be described in detail based on the exemplary embodiments thereof.

The pressure sensor package of exemplary embodiments of the invention includes two structures: a structure having a first bump on a first conductive section arranged at a peripheral region of a semiconductor substrate (a first pressure sensor package); and a structure including a second conductive section disposed on the first conductive section at the peripheral region of the semiconductor substrate, and having a second bump disposed on the second conductive section so as not to overlap with the first conductive section (second pressure sensor package). The embodiments described below are illustrative only, and the gauge arrangement, for example, is not limited thereto.

First Exemplary Embodiment

Figure 1B:
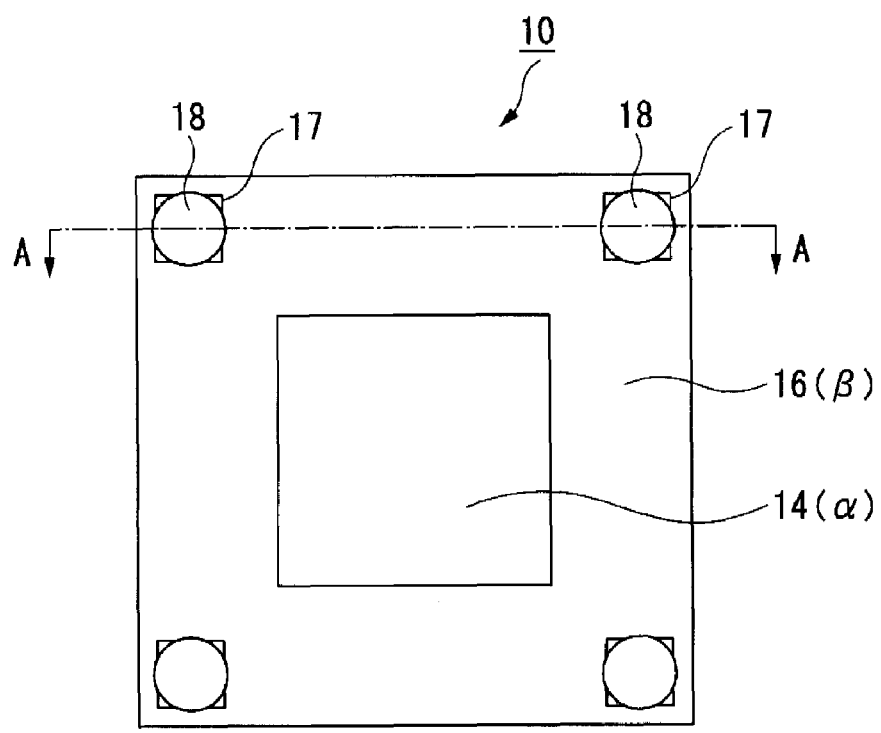
FIG. 1B is a plan view of the pressure sensor package of the first exemplary embodiment of the invention.
Figure 2:
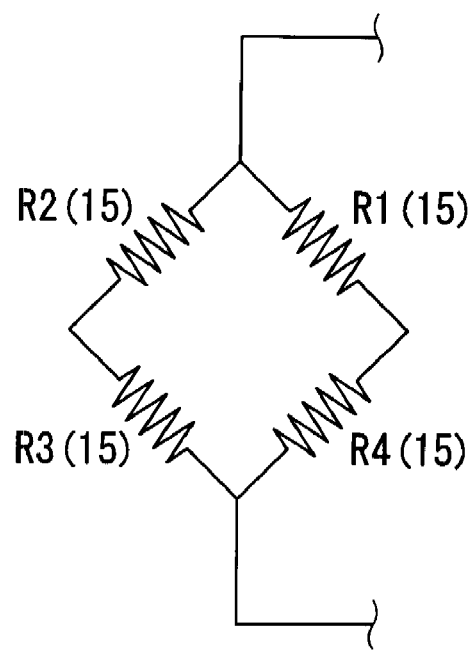
FIG. 2 is an electric wiring diagram of a pressure sensitive element (gauge resistance element).

Referring to FIGS. 1A, 1B and 2, a pressure sensor package (a first pressure sensor package) according to a first exemplary embodiment of the invention will be described.

FIG. 1A shows a cross section taken along line A-A of the pressure sensor package of the first exemplary embodiment shown in FIG. 1B.

As shown in FIGS. 1A and 1B, a pressure sensor 11 constituting the first pressure sensor package 10 includes a plate-like semiconductor substrate 12 and a reference pressure cavity) 13 inside a plate-thickness direction central region a on a surface of the semiconductor substrate 12. The space extends substantially parallel with the surface of the semiconductor substrate 12. A thin-plate region above the reference pressure cavity 13 serves as a diaphragm section 14. Multiple pressure sensitive elements 15 are arranged in the diaphragm section 14 so as to extend to the peripheral region. A first conductive portion 17 is arranged on the peripheral region β excluding the diaphragm section on the surface and electrically connected to the pressure sensitive element 15.

As shown in the drawings, the peripheral region β excluding the first conductive section 17 where the first bump 18 is provided may be covered with a thin insulating section 16. The thin insulating section 16 may be a passivation film, such as a nitride film and an oxide film. In this structure, the pressure sensitive element 15 cart be covered with the insulating section 16.

In the pressure sensor package 10 of the first exemplary embodiment, the entire peripheral region β is covered with the insulating section 16 excluding the first conductive section 17 where the first bump 18 is provided. Thus, when the first bump 18 is to be connected to an external substrate (not shown), the insulation property of the pressure sensitive element 15 with respect to the external substrate can be ensured.

The insulating section 16 blocks contact of the pressure sensitive element 15 with the surrounding atmosphere, which improves corrosion resistance of the pressure sensitive element 15. The presence of the insulating section 16 significantly decreases external mechanical influence exerted directly on the pressure sensitive element 15 other than through the diaphragm section 14.

Each of the first conductive sections 17 constituting the pressure sensor 11 includes the first bump 18 disposed thereon and electrically connected thereto.

Gauge resistance elements R1 to R4 as illustrated in FIG. 2 are provided on the surface of the substrate 12. The gauge resistance elements function as pressure sensitive elements 15. The gauge resistance elements are electrically connected to one another via lead wires (not shown) to form a Wheatstone bridge (FIG. 2). The gauge resistance elements may be disposed at a peripheral portion of the diaphragm section 14. This is because both tensile stress and compression stress are often exerted on the pressure sensitive element 15, and thus a highly sensitive pressure sensor can be obtained.

As shown in FIG. 1A, in the pressure sensor 11, the thickness D1 of the semiconductor substrate at the peripheral region, the thickness D2 of the diaphragm section, the height D3 of the reference pressure cavity 13, and the remaining thickness D4 of the semiconductor substrate excluding D2 and D3 at the central region may satisfy the relationships: (D2+D3)<<D4 and D1 being nearly equal to D4.

In the first exemplary embodiment, D1 to D4 are selected so as to satisfy the above relationships.

When D1 to D4 satisfy the above relationships, the pressure sensor 11 constituting the first pressure sensor package 10 includes, in the central region α thereof, the diaphragm section 14 with a significantly smaller thickness D2 and reference pressure cavity 13 with a substantially smaller height D3 when seen from the surface of the semiconductor substrate 12 from the thickness direction. The remaining section below (above, in FIG. 1A) the reference pressure cavity 13 has a thickness D4 sufficiently larger than to the thickness D2+D3. A thickness D4 of the semiconductor substrate 12 is designed to have a value substantially equal to the entire thickness D1 of the semiconductor substrate 12 in the peripheral region β. That is, the dimension (D2+D3), the sum of the thickness D2 of the diaphragm section 14 and the height D3 of the reference pressure cavity 13, is as small, for example, as 5 to 20 micrometers. The reference pressure cavity 13 height D3 is, for example, 1 to 3 micrometers.

Although the central region and the peripheral region are distinctively described, these regions are made from a single, integrated semiconductor substrate.

In a conventional sensor chip, a bonding wire is essentially required for packaging in order to prevent thermal influence such as a strain on the chip. As a result, the chip size cannot be made more compact. In the exemplary embodiments, however, a bump is provided at the sensor chip to allow direct connection of the sensor chip to other elements via the bump.

A conventionally-required casing for containing the pressure sensor 11 is not required in the pressure sensor package 10 of the first exemplary embodiment. Since the pressure sensor 11 has the first bump 18 for connecting to an external substrate, the pressure sensor package 10 can be made significantly compact. The components for the casing and the process for packaging the pressure sensor 11 in the casing can be eliminated to significantly reduce manufacturing cost. Further, excellent connecting reliability can be obtained with the structure in which a connection is established only between the first bump 18 and the external substrate without using bonding wires or leads that may produce multiple electric connection sites. Note that the exemplary embodiment is illustrative only, and may be subject to changes in the arrangement of the gauge resistance elements or lead resistance elements.

Second Exemplary Embodiment

Next, with reference to FIGS. 3A and 3B, a second pressure sensor package according to a second exemplary embodiment of the invention will be described.

Figure 3A:
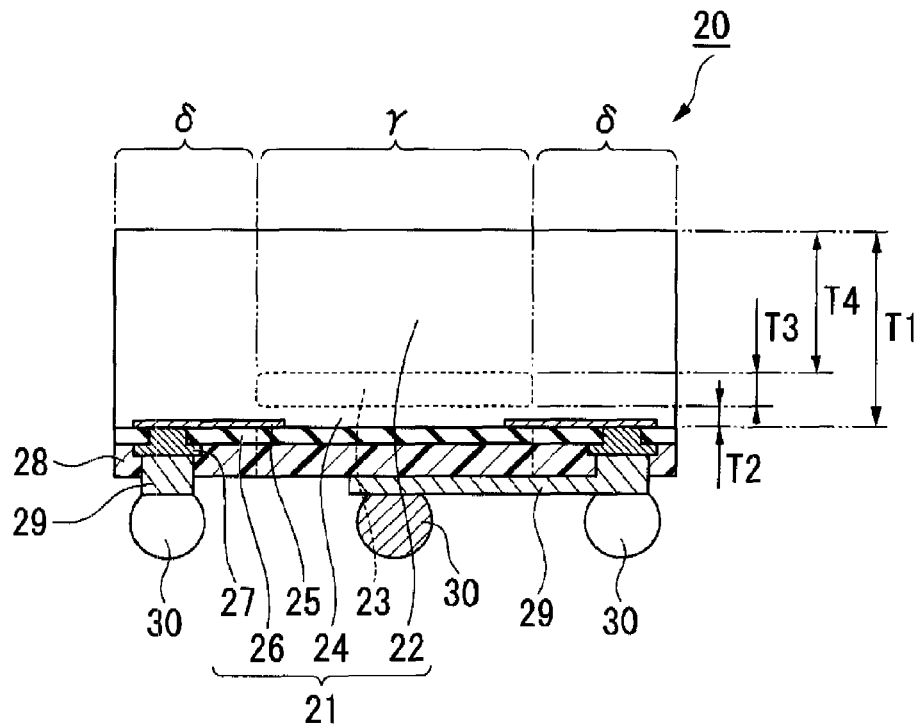
FIG. 3A is a side cross-sectional view of a main part of a pressure sensor package of a second exemplary embodiment of the invention.
Figure 3B:
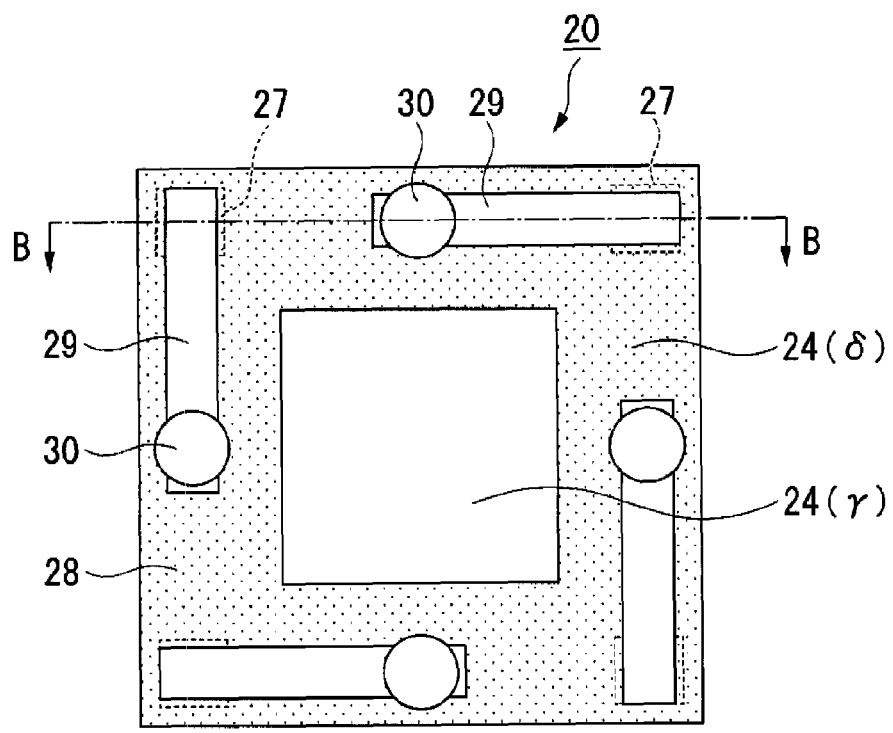
FIG. 3B is a plan view of the pressure sensor package of the second exemplary embodiment of the invention.

FIG. 3A shows a cross section taken along line B-B of the pressure sensor package of second exemplary embodiment shown in FIG. 3B.

As shown in FIGS. 3A and 3B, a pressure sensor 21 constituting the first pressure sensor package 20 includes a plate-like semiconductor substrate 22 and a reference pressure cavity 23 inside a plate-thickness direction central region a on a surface of the semiconductor substrate 22. The reference pressure cavity 23 extends substantially parallel with the surface of the semiconductor substrate 22. A thin-plate region above the reference pressure cavity 23 serves as a diaphragm section 24. Multiple pressure sensitive elements are arranged in the diaphragm section 24. A first conductive portion 27 is arranged on the peripheral region δ excluding the diaphragm section on the surface and electrically connected to the pressure sensitive element 25.

As shown in the drawings, the peripheral region δ excluding the first conductive section 27 where a second conductive section 29 and the second bump 30 is provided may be covered with a thin insulating section 26. The thin insulating section 26 may be a passivation film, such as s nitride film and an oxide film. In this structure, the pressure sensitive element 25 can be covered with the insulating section 26.

In the pressure sensor package 20 of the second exemplary embodiment, the entire peripheral region δ is covered with the insulating section 26 excluding the region where the first conductive section 27 is to be provided. Thus, when the pressure sensor 21 is left or kept before the second conductive section 29 and the second bump 30 is produced, the insulation property of the pressure sensitive element 25 with respect to the external substrate can be ensured.

The insulating section 26 blocks contact of the pressure sensitive element 25 with surrounding atmosphere, which improves corrosion resistance of the pressure sensitive element 25. The presence of the insulating section 26 significantly decreases external mechanical influence exerted directly from the outside on the pressure sensitive element 25 thereof, but not via the diaphragm section 24.

In the pressure sensor package 20 according to the second exemplary embodiment, the pressure sensor 21 includes the first insulating section 28, the second conductive section 29, and the second bump 30. The first insulating section 28 is disposed to cover the peripheral region δ. The second conductive section 29 is disposed on the first insulating section 28, and is electrically connected to the first conductive section 27. The second bump 30 is electrically connected to the second conductive section 29 at an area where the second conductive section 29 does not overlap with the first conductive section 27. The first insulating section 28 may include photosensitive resin, such as epoxy, as a stress buffer layer.

Gauge resistance elements R1 to R4 illustrated in FIG. 2 are provided on the pressure sensitive element 25 of the second exemplary embodiment in the same manner as that shown in FIGS. 1A and 1B. Each of the gauge resistance elements is electrically connected to one another via lead wires (not shown) to form a Wheatstone bridge (FIG. 2). In this casing shown in FIGS. 3A and 3B, the gauge resistance elements are preferably disposed at a peripheral portion of the diaphragm section 24 where both tensile stress and compression stress are often exerted.

As shown in FIG. 3A, in the pressure sensor 21, the thickness T1 of the semiconductor substrate at the peripheral region, the thickness T2 of the diaphragm section, the height T3 of the reference pressure cavity 23, and the remaining thickness T4 of the semiconductor substrate excluding T2 and T3 at the central region may satisfy the relationships: (T2+T3)<<T4 and T1 being nearly equal to T4.

In the second exemplary embodiment, T1 to T4 are selected so as to satisfy the above relationships.

When T1 to T4 satisfy the above relationships, the pressure sensor 21 constituting the second pressure sensor package 20 includes, in the central region γ thereof, a diaphragm section 24 with a significantly small thickness T2 and a reference pressure cavity 23 with a substantially small height T3 when seen from the surface of the semiconductor substrate 22 in the thickness direction. The remaining section below (above, in FIG. 3A) the reference pressure cavity 23 has a thickness T4 is sufficiently larger than the thickness T2+T3. Thickness T4 of the semiconductor substrate 22 is designed to have a value substantially equal to the entire thickness T1 of the semiconductor substrate 22 in the peripheral region δ. That is, the dimension (T2+T3), the sum of the thickness T2 of the diaphragm section 24 and the height T3 of the reference pressure cavity 23, is, for example, as small as 5 to 20 micrometers. The reference pressure cavity 23 height T3 is, for example, 1 to 3 micrometers.

Although the central region and the peripheral region are distinctively described, these regions are made from a single, integrated semiconductor substrate.

In this structure, the second conductive section 29 allows the second bump 30 to be disposed at any position on the peripheral region δ so as not to overlap with the first conductive section 27. Thus, the second bump 30 may be provided at any connecting site according to the demand of the external substrate. As a result, the pressure sensor package 20 according to the second exemplary embodiment has a high degree of freedom on connecting sites with respect to the external substrate.

In a conventional sensor chip, a bonding wire is essentially required for packaging. As a result, the chip size cannot be made compact. In the exemplary embodiments, however, the second bump 30 is provided at the sensor chip to allow direct connection of the sensor chip to other elements via the second bump 30.

A conventionally-required casing for containing the pressure sensor 21 is not required in the pressure sensor package 20 of the first exemplary embodiment. Since the second bump 30 for connecting to an external substrate is provided at the pressure sensor 21, the pressure sensor package 20 can be made significantly compact. The components for the casing and the process for packaging the pressure sensor 21 in the casing can be eliminated to significantly reduce manufacturing cost. Further, excellent connecting reliability can be obtained with a structure in which a connection is established only between the second bump 30 and the external substrate without using bonding wires or leads that may produce multiple electric connection sites. Note that the exemplary embodiment is illustrative only, and may be subject to changes in the arrangement of the gauge resistance elements or lead resistance elements.

Third Exemplary Embodiment

Figure 4A:
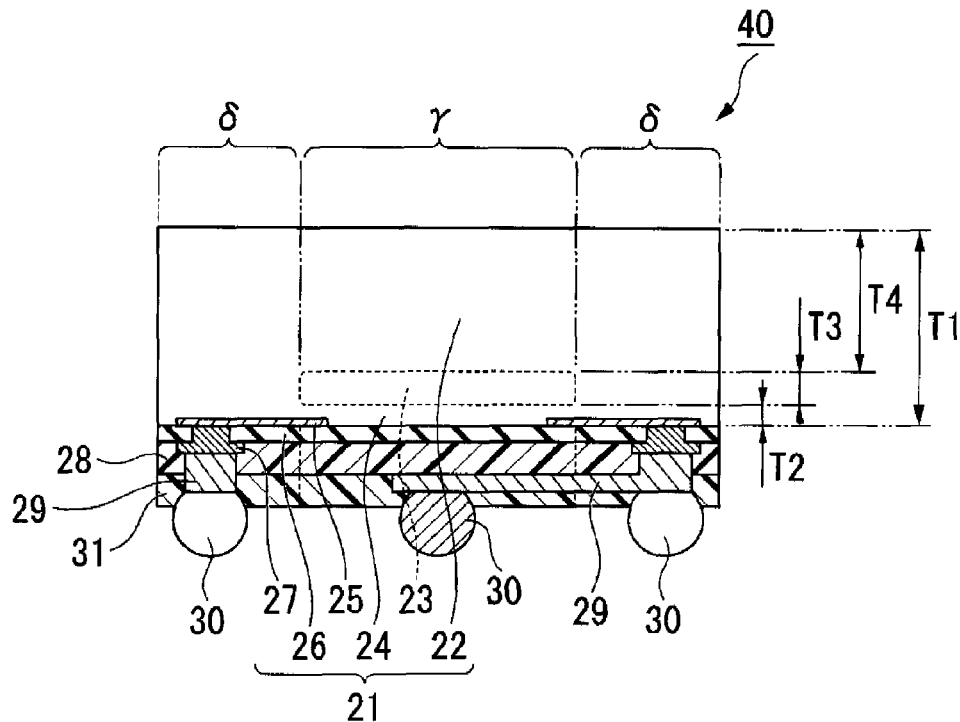
FIG. 4A is a side cross-sectional view of a main part of a pressure sensor package of a third exemplary embodiment of the invention.

Next, with reference to FIGS. 4A and 4B, a pressure sensor package (based on the second pressure sensor package) according to a third exemplary embodiment of the invention will be described. FIG. 4A shows a cross section taken along line C-C of the pressure sensor package of the third exemplary embodiment shown in FIG. 4B.

Figure 4B:
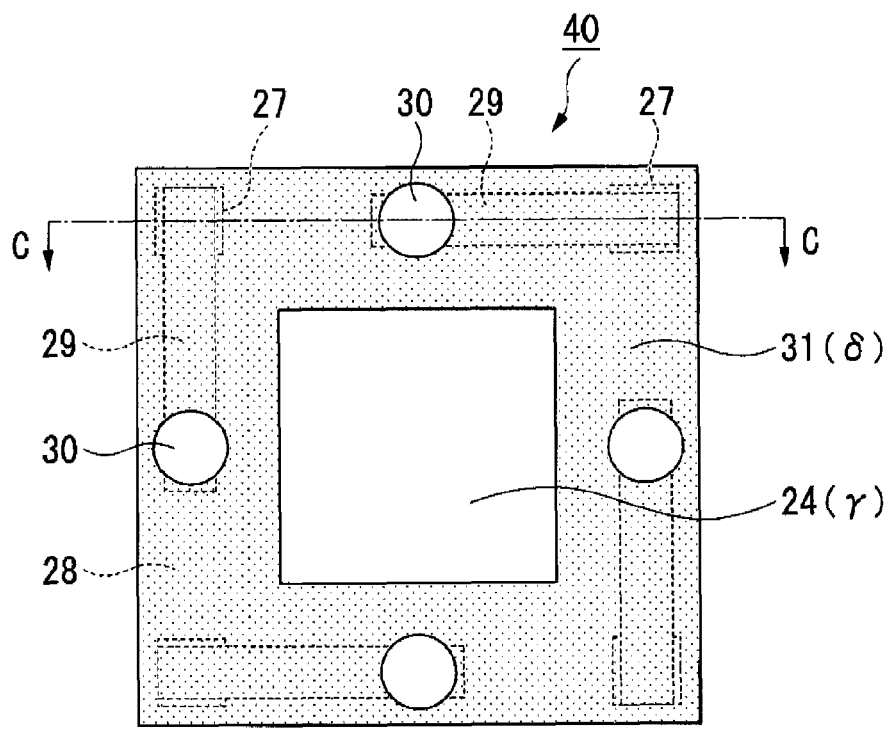
FIG. 4B is a plan view of the pressure sensor package of the third exemplary embodiment of the invention.

In the pressure sensor package 40 shown in FIGS. 4A and 4B, a second insulating section 31 covers a peripheral region δ so that only the second bump 30 is exposed, based on the second pressure sensor package 20 shown in FIGS. 3A and 3B. The second insulating section 31 may include epoxy resin as in the first insulating section 28.

In the second pressure sensor package 40 of the third exemplary embodiment, the entire peripheral region δ is covered with the second insulating section 31 excluding the second bump 30. Thus, when the second bump 30 is to be connected to an external substrate (not shown), the insulation property of the second conductive section 29 with respect to the external substrate can be ensured.

The second insulating section 31 blocks contact of the second conductive section 29 with the surrounding atmosphere, which improves corrosion resistance of the second conductive section 29. The presence of the second insulating section 31 significantly decreases external mechanical influence exerted on the second conductive section 29.

Figure 5A:
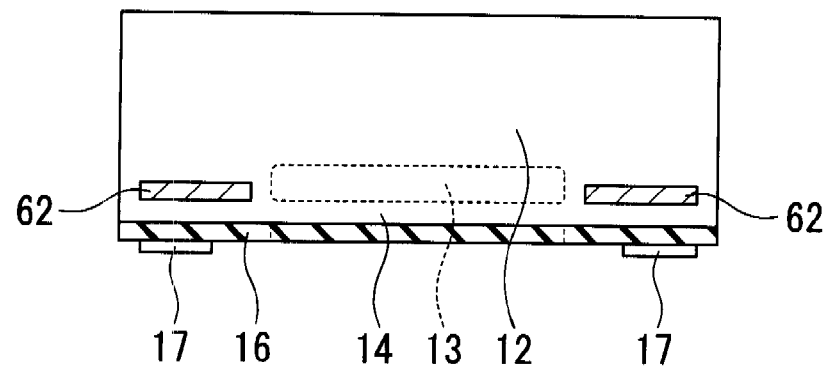
FIG. 5A is a cross-sectional view of main part of a substrate in which an electric circuit is integrated.
Figure 5B:
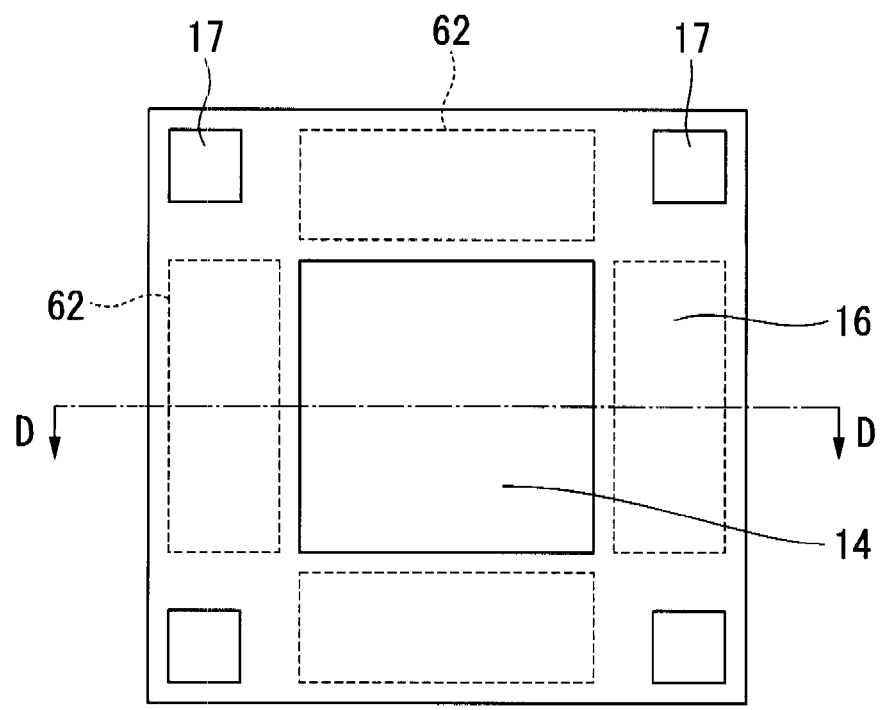
FIG. 5B is a plan view of the substrate of FIG. 5A.

A structure having various circuits provided inside the substrate that constitutes a main part of the sensor package will be described. Such a substrate is shown in FIGS. 5A and 5B. FIG. 5A shows a cross section taken along line D-D of the substrate shown in FIG. 5B.

A pressure sensor package 60 which includes the substrate shown in FIG. 5 is based on the first pressure sensor package 10 and the second pressure sensor package 20 shown in FIGS. 1A to 4B. The pressure sensor package 60 has a circuit 62 provided at a peripheral region β (δ) of the semiconductor substrate 11 (21) where a first conductive section 17 (27) is not provided. The circuit 62 may be a signal amplification circuit or a compensation circuit. The first conductive section 17 (27) functions as an electrode pad.

The circuit 62 may be disposed at any position on the peripheral region β (δ) where they do not overlap with the diaphragm section 64, and is not limited to the described positions. To clearly show the physical relationship of the first conductive section 17 (27) and the circuit 62 in FIGS. 5A and 5B, illustration of other structures is omitted.

As in the first to third exemplary embodiments, since the pressure sensor package 60 includes the circuit 62 inside of the substrate, conventionally-required external structures such as ASIC are no longer required. The components for connection and the process for connecting can be eliminated to significantly reduce manufacturing cost. Thus, external physical or chemical influence on the substrate is eliminated to improve electric connecting performance.

Here, with reference to FIG. 6, an example in which a pressure sensor package is mounted on an external substrate will be described.

Figure 6:
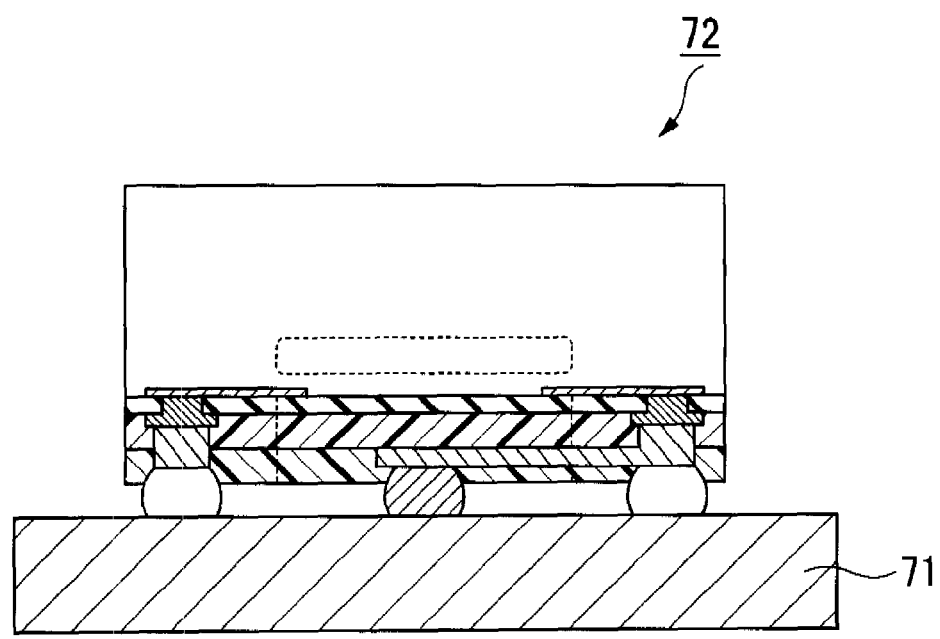
FIG. 6 is a side cross-sectional view of a main part of a pressure sensor package mounted on an external substrate.

It is shown in FIG. 6 that a pressure sensor package 72 is connected via its bump 73 to an external substrate 71 consisting of various kinds of printed circuit boards. That is, the pressure sensor package 72 may be mounted as a chip sized part.

To clearly show the mounting state in FIG. 6, illustration of other structures is omitted. Although the arrangement of the bump shown in FIG. 6 is that of the pressure sensor package according to the second exemplary embodiment, the arrangement is not limited to the same. A chip-size packaging can also be applied to the pressure sensor package according to the first exemplary embodiment.

Referring now to FIGS. 7 to 10, a manufacturing process of the second pressure sensor package according to the third exemplary embodiment shown in FIGS. 4A and 4B will be described.

In the exemplary embodiments of the invention, processing for chip-size packaging is performed in a wafer level with respect to the pressure sensor. Such a pressure sensor having a reference pressure cavity 23 inside of the semiconductor substrate is produced in a method described in S. Armbruster et al., "A Novel Micromachining Process for the Fabrication of Monocrystalline SI-Membranes Using Porous Silicon", digest of technical papers transducers, March 2003, pp. 246.

Figure 7A:
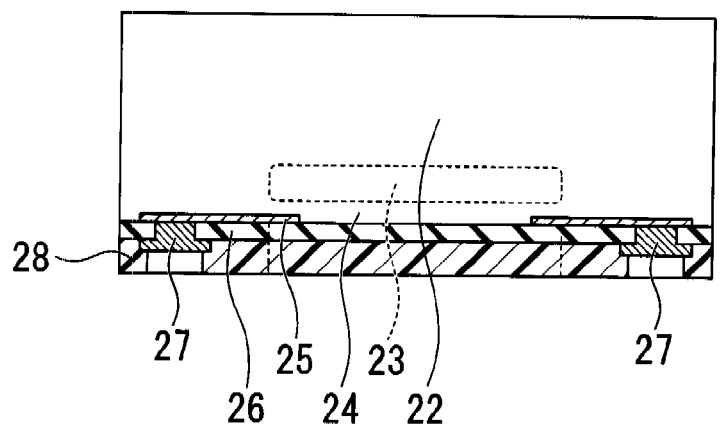
FIG. 7A is a side cross-sectional view of a main part showing a manufacturing process of the pressure sensor package of the third exemplary embodiment.
Figure 7B:
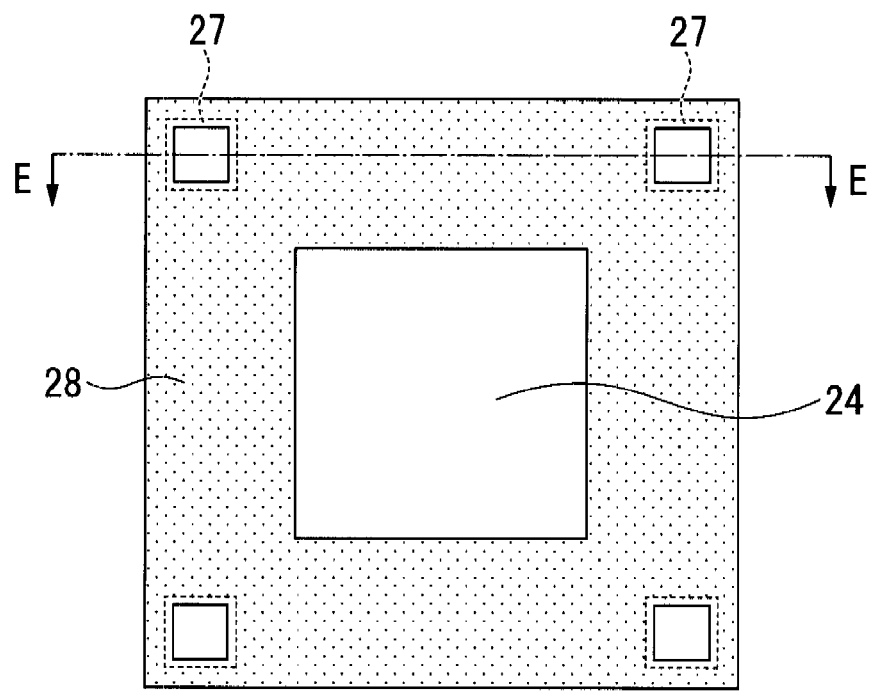
FIG. 7B is a plan view of the pressure sensor package of FIG. 7A.

First, as shown in FIGS. 7A and 7B, an insulating resin layer 28 is formed in the pressure sensor 21 excluding the region where the diaphragm 24 is provided. In this method, photosensitive resin such as epoxy resin is applied to the entire surface of the wafer including the diaphragm 24. Then, the only resin on the diaphragm 24 section is removed through exposure development and the remaining resin is formed as an insulating resin layer. In this process, the resin on the first conductive section 27 functioning as an electrode pad is also removed to efficiently provide an opening for electric wiring.

Figure 8A:
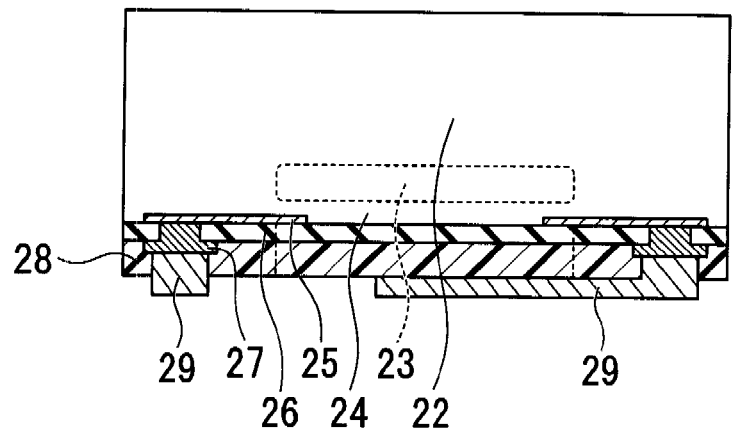
FIG. 8A is a side cross-sectional view of the main part of the pressure sensor package, showing a next process of the process in FIG. 7A.
Figure 8B:
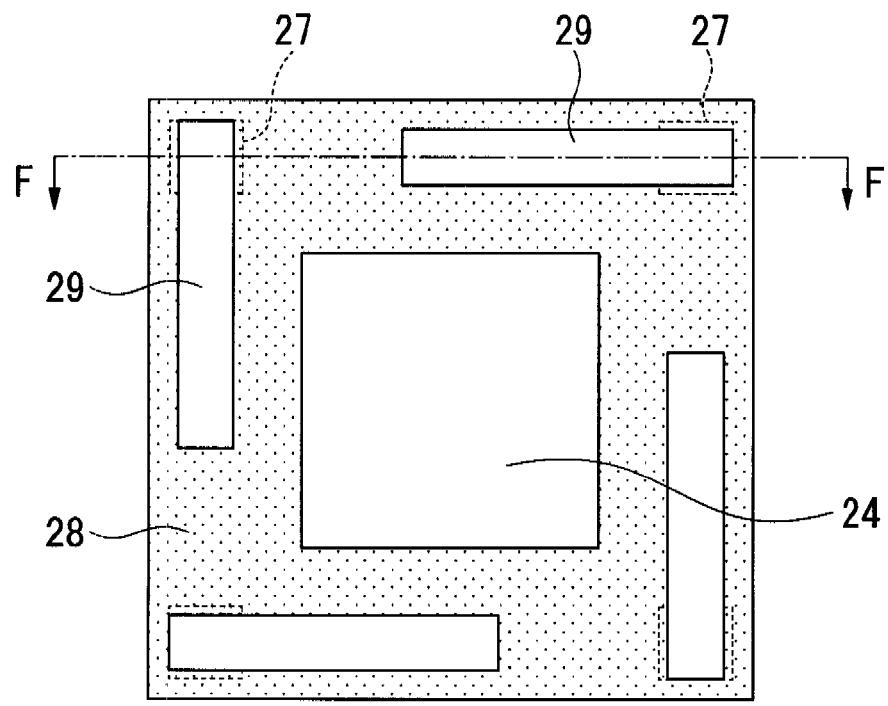
FIG. 8B is a plan view of the pressure sensor package of FIG. 8A.

Next, as shown in FIGS. 8A and 8B, the wiring layer/re-routing is formed as the second conductive section 29 which electrically connects to the first conductive section 27. Although the wiring layer is made of plated copper (Cu) in this method, the wiring layer may also be formed by other film deposition method including, but not limited to, sputtering and CVD. In addition, other metallic materials including Au and Ni or the combination thereof may be used.

Figure 9A:
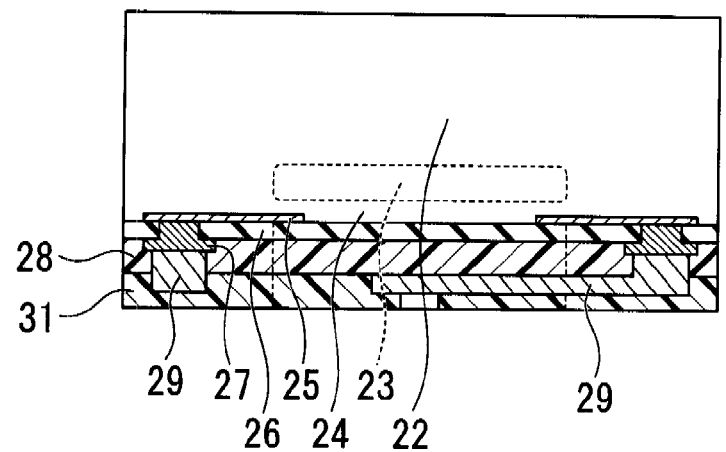
FIG. 9A is a side cross-sectional view of the main part of the pressure sensor package, showing a next process of the process in FIG. 8A.
Figure 9B:
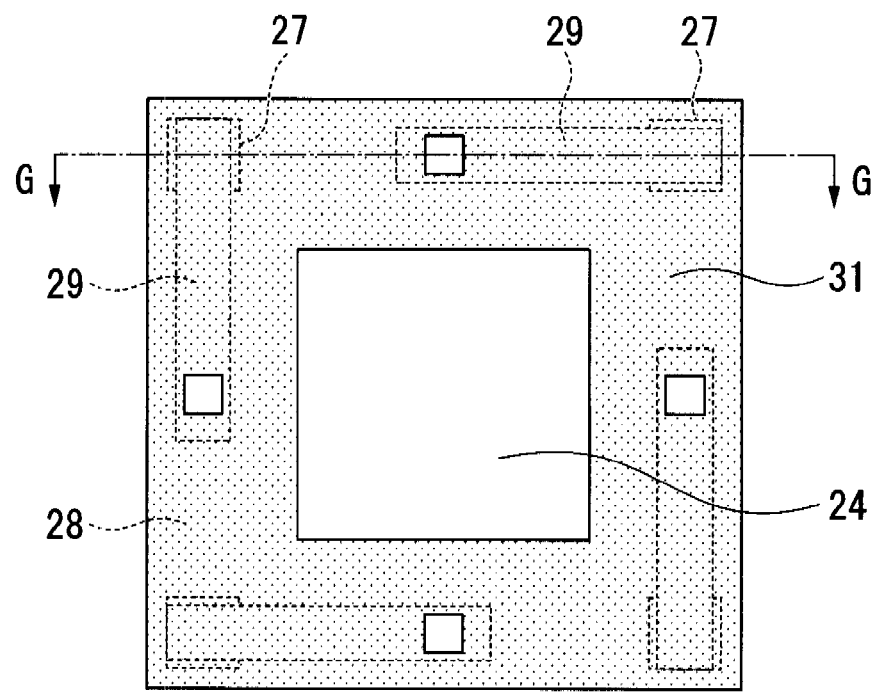
FIG. 9B is a plan view of the pressure sensor package of FIG. 9A.

Then, as shown in FIGS. 9A and 9B, the insulating resin layer is formed as the second insulating section 31 to include the second conductive section 29 excluding the region where the diaphragm section 24 is provided. Then, photosensitive resin such as epoxy resin is applied to the entire surface of the wafer including the diaphragm. Then, the resin on the diaphragm section is removed through exposure development to efficiently provide an opening for bump formation.

Figure 10A:
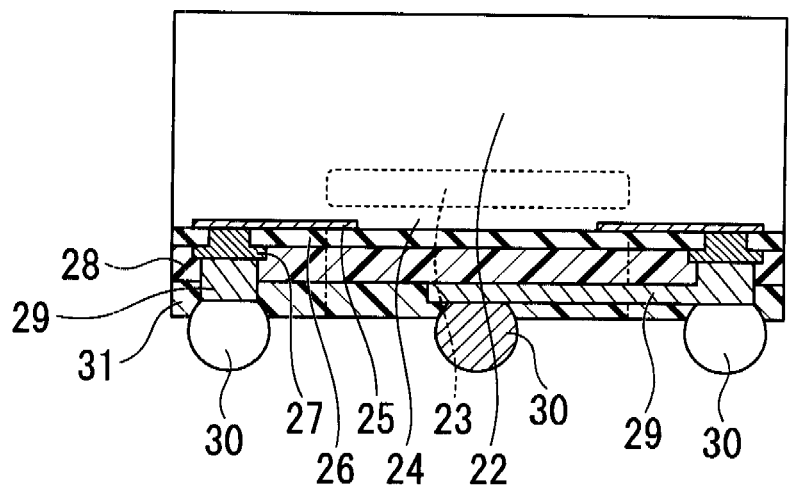
FIG. 10A is a side cross-sectional view of the main part of the pressure sensor package, showing a next process of the process in FIG. 9A.
Figure 10B:
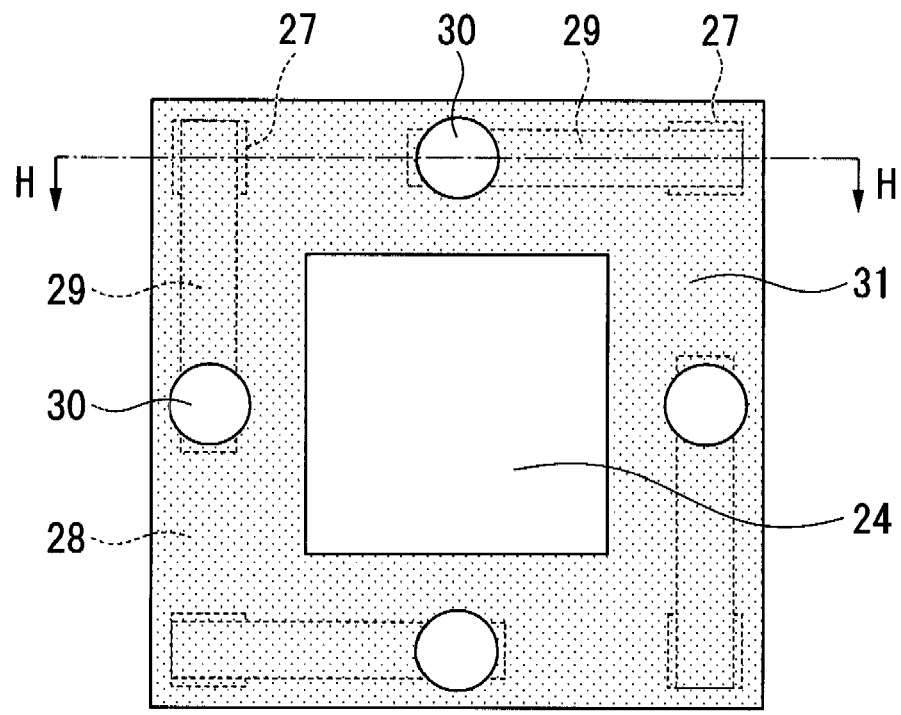
FIG. 10B is a plan view of the pressure sensor package of FIG. 10A.
Figure 11:
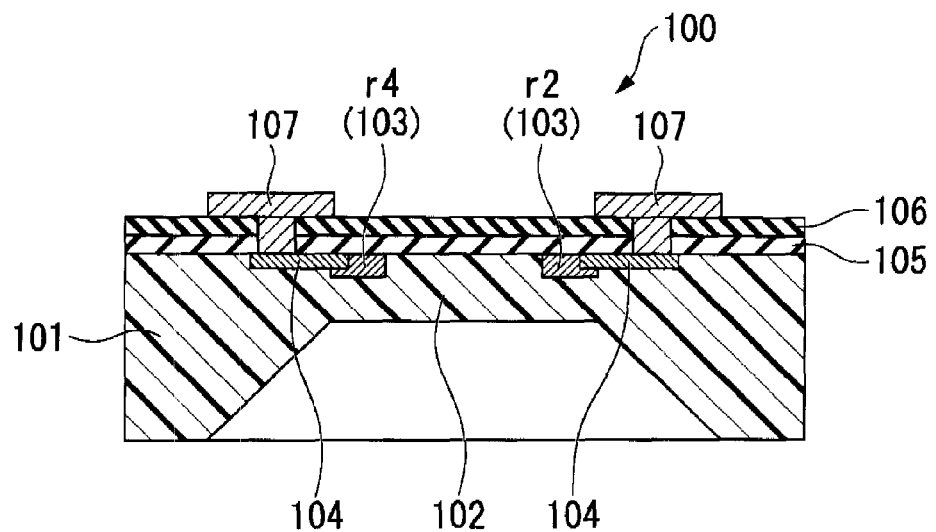
FIG. 11 is a side cross-sectional view of a conventional pressure sensor.
Figure 12:
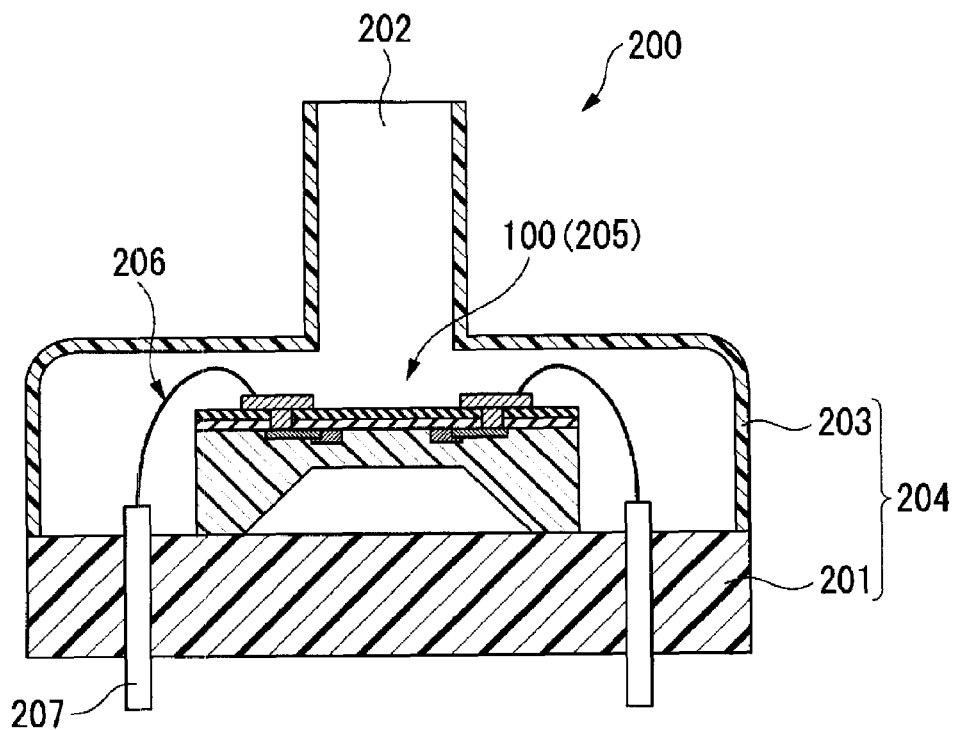
FIG. 12 is a side cross-sectional view of a conventional pressure sensor package.

Finally, as shown in FIGS. 10A and 10B, the bump 30 is formed so as to electrically connect to the wiring layer which constitutes the second conductive section 29. Although the bump is formed by mounting a solder ball, the bump may also be formed in various methods including, but not limited to, printing or plating.

The second pressure sensor package having the structure (the third exemplary embodiment) described in FIGS. 4A and 4B is manufactured in the process described above. The pressure sensor packages shown in FIGS. 1A, 1B, 3A and 3B may also be manufactured in the similar method.

Fourth Exemplary Embodiment

Figure 13A:
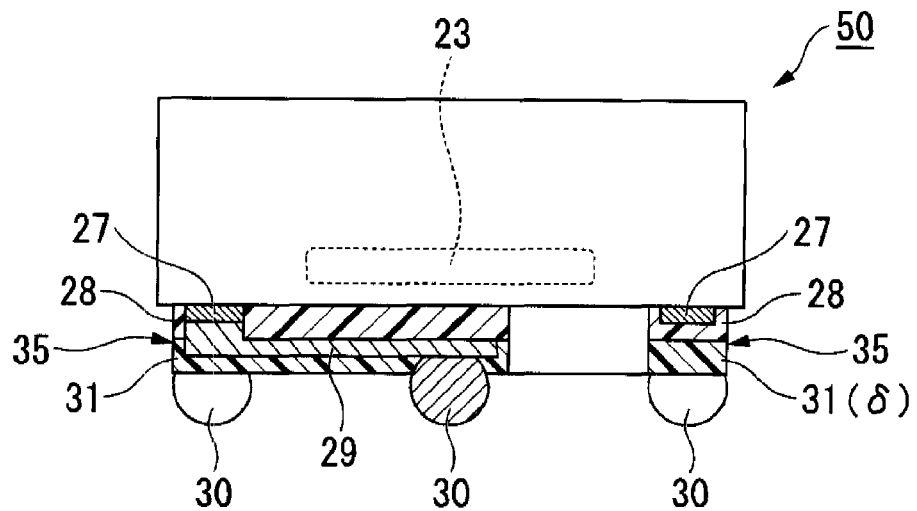
FIG. 13A is a side cross-sectional view of a main part of a pressure sensor package of a fourth exemplary embodiment of the invention.
Figure 13B:
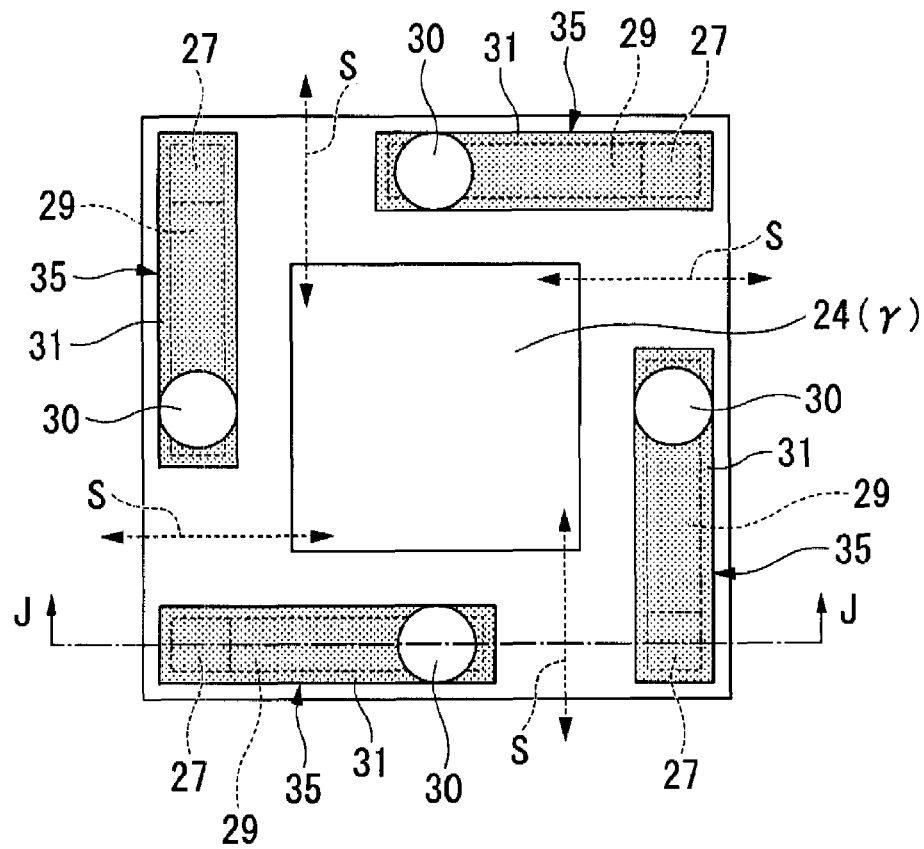
FIG. 13B is a plan view of the pressure sensor package of the fourth exemplary embodiment of the invention.

First, with reference to FIGS. 13A and 13B, a pressure sensor package (a second pressure sensor package) according to a fourth exemplary embodiment of the invention will be described. In FIGS. 13A and 13B, an insulating layer, such as passivation layer, is not shown.

FIG. 13A shows a cross section taken along line J-J of the pressure sensor package according to the fourth exemplary embodiment shown in FIG. 13B. In the pressure sensor package 40 according to the third exemplary embodiment shown in FIGS. 4A and 4B, the first insulating section is made in a continuous manner. In the pressure sensor package 50 according to the fourth exemplary embodiment shown in FIGS. 13A and 13B, a second bump 30 forms an island structure 35. In the island structure 35, the first insulating section 28 and the second insulating section 31 near the second bump 30 are provided separately.

The pressure sensor package 50 shown in FIGS. 13A and 13B includes a second conductive section 29 and a second insulating section 31 to cover the second conductive section 29. The second conductive section 29 is disposed on a first insulating section 28 and is electrically connected to a first conductive section 27 that is partly exposed from the first insulating section 28. The second bump 30 is disposed on the second conductive section 29 at a position where the second conductive section 29 is partly exposed through an opening formed in the second insulating section 31 so as not to overlap with the first conductive section.

With this structure, influence of the insulating section (insulating resin layer) exerted on the diaphragm section may be significantly reduced. As a result, the sensitivity of the diaphragm can be kept high to produce a highly accurate sensor.

As a secondary effect of forming the island structure 35 corresponding to the second bump 30, a pressure passage S can be provided between the island structures 35 for keeping the pressure of between the diaphragm section 24 and the pressure outside of the semiconductor substrate 22 constant.

That is, the central region of the semiconductor substrate 22 where the diaphragm section 24 is provided is not fully surrounded by the first insulating section 28 and the second insulating section 31. Thus, the passage S serves as a pressure inflow and outflow path of the semiconductor substrate 22.

If such a pressure sensor package 50 is disposed in a narrow conduit, for example, the external pressure is accurately transmitted to the diaphragm section 24 through the passage S between the island structures 35. In this manner, when the pressure sensor packages 50 are closely disposed in a narrow environment, it is possible to measure the pressure accurately and stably.

Although the island structure 35 may be provided for each second bump 30, several second bumps may also constitute the island structure 35.

Figure 14A:
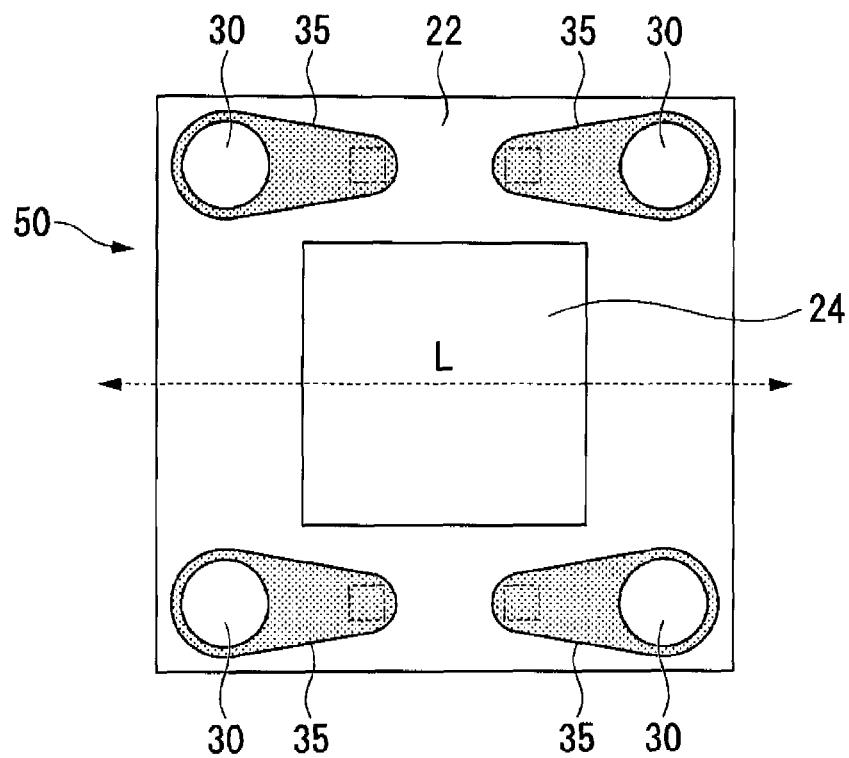
FIG. 14A is a plan view of a modified exemplary embodiment of the pressure sensor package.

The arrangement of the second bump 30 on the semiconductor substrate 22 is not limited to that shown in FIGS. 13A and 13B, in which the second bump 30 is disposed at a middle portion of each side of the peripheral region excluding the diaphragm section 24. Rather, as shown in FIG. 14A, the second bump 30 may be disposed at a corner of the four sides of the peripheral region of the semiconductor substrate 22 excluding the region where the diaphragm section 24 is provided. The island structure 35 surrounding the second bump 30 may be disposed so as to extend along with two sides in the four sides of the peripheral region.

With this structure, a wide opening may be provided along the longitudinal direction L of the island structure 35 in which gas and fluid flow, so that the gas and fluid may flow smoothly. For example, if the pressure sensor package 50 is disposed in a long, narrow pressure passage such that the extending direction of the pressure passage coincides with the longitudinal direction L of the island structure 35, the pressure variation in the pressure passage can be accurately detected.

Figure 14B:
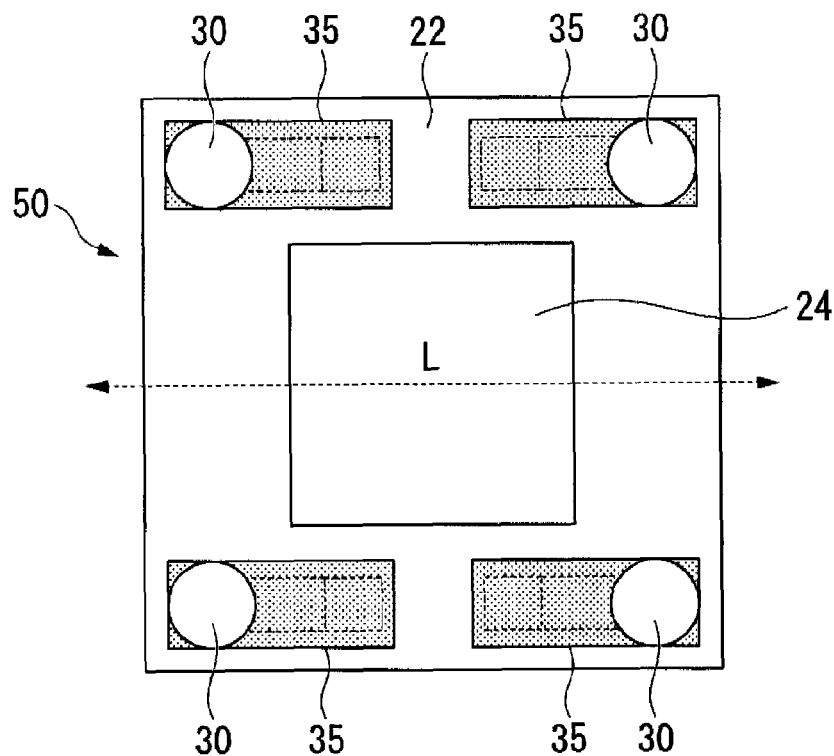
FIG. 14B is a plan view of another modified exemplary embodiment of the pressure sensor package.

In the structure of FIG. 14A, although the island structure 35 is formed in a teardrop shape when seen as a plan view, the island structure 35 may also be formed in a rectangular shape as shown in FIG. 14B. Further, the island structure 35 may also be formed in various shapes including ellipse and infinite shape so long as a certain interval of the island structures 35 is kept.

In order to verify the effect of the island structure 35, comparison was made on pressure sensing characteristics between the pressure sensor having the first and second insulating sections 28, 31 formed in island shapes and a conventional pressure sensor having a spreading insulating section. As a result, the former pressure sensor had greatly improved offset temperature characteristic that may change with external stress. Thus, the island structure in the exemplary embodiment was verified to be effective in reduction of the influence of stress exerted on the diaphragm. Although the structure of the present embodiment has a second insulating resin layer, the same advantageous effect can be obtained in a structure with an island-shaped first insulating resin layer and no second insulating resin layer.

Referring to FIGS. 15A to 15D, several patterns of forming second bumps 30 of the pressure sensor package 90 will be described.

Figure 15A:
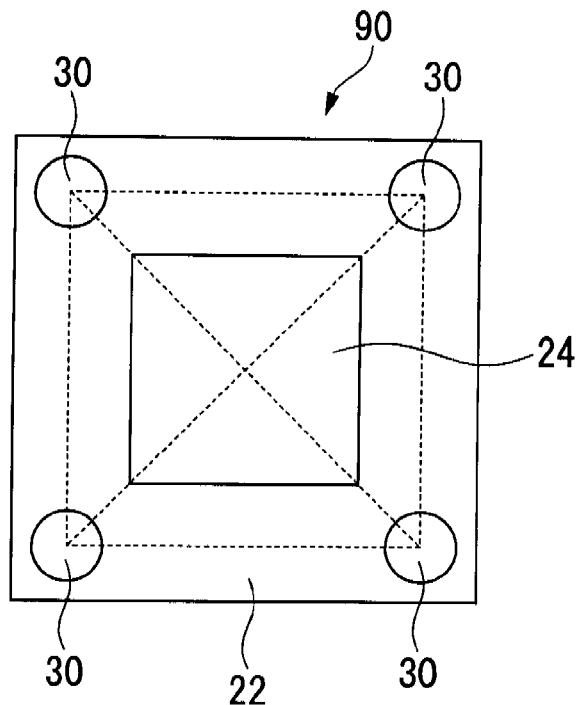
FIG. 15A is a plan view showing an exemplary arrangement of second bumps.

FIG. 15A shows an example in which the second bumps 30 are disposed at four corners of the rectangular semiconductor substrate 22. The second bumps 30 are disposed symmetrically at equal intervals. In this manner, the stress is equally exerted on the second bumps 30 and thus variations in the detecting characteristics of a pressure sensor package 90 can be suppressed.

Figure 15B:
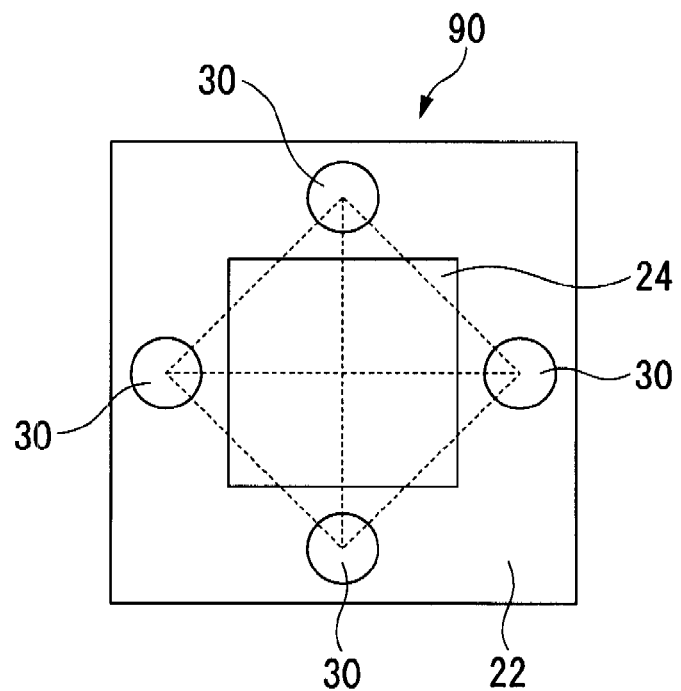
FIG. 15B is a plan view showing another exemplary arrangement of the second bumps.

Each of the second bumps 30 may also be disposed at a middle portion of each side of the semiconductor substrate 22 in a symmetric manner at equal intervals as shown in FIG. 15B. In this manner, the same advantageous effect as that of the structure shown in FIG. 15A can obtained.

Figure 15C:
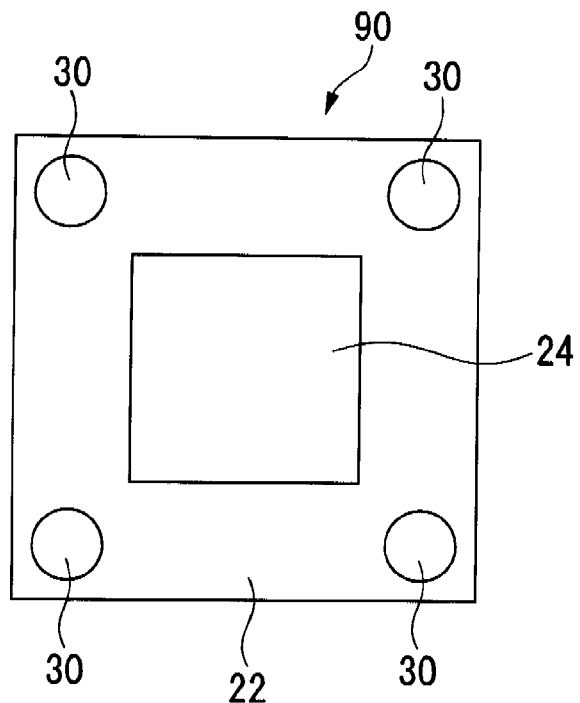
FIG. 15C is a plan view showing a further exemplary arrangement of the second bumps.
Figure 15D:
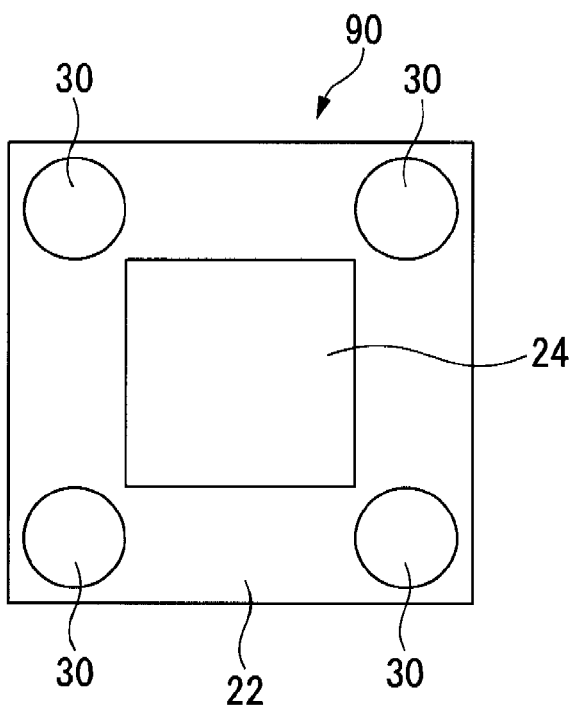
FIG. 15D is a plan view showing another exemplary arrangement of the second bumps.

As shown in FIGS. 15C and 15D, the second bumps 30 disposed symmetrically at equal intervals are preferably formed at the same size. In this manner, the stress will be equally exerted on the second bumps 30. Thus, variations in the detecting characteristics of the pressure sensor package 90 can be prevented in the structure shown in FIGS. 15A and 15B. Although an absolute pressure sensor has been described in the foregoing exemplary embodiments, a relative pressure sensor may also be employed. In the relative pressure sensor, a through hole is formed in the central section to extend to a reference pressure cavity so long as no stress is exerted on the diaphragm section.

Referring now to FIGS. 16A to 17B, operations and advantageous effects characteristic to the pressure sensor package according to exemplary embodiments of the invention over a conventional structure will be described.

A simulation (experiment) was conducted to compare the package structure of exemplary embodiments of invention (FIG. 16A) with a large substrate portion at an opposite side of the surface on which the diaphragm is provided to support the diaphragm and a conventional structure (FIG. 17A) with no support (substrate portion).

Figure 16A:
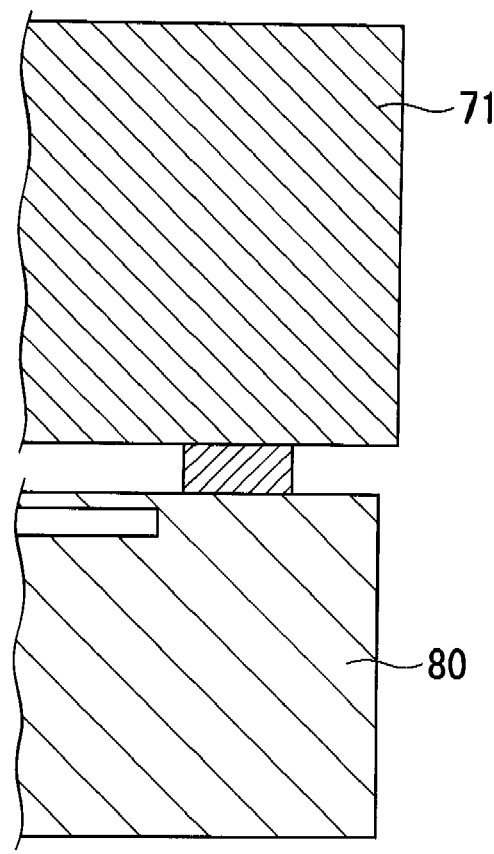
FIG. 16A is a side cross-sectional view of a main part of the pressure sensor package according to an exemplary embodiment of the invention mounted on an external substrate.
Figure 16B:
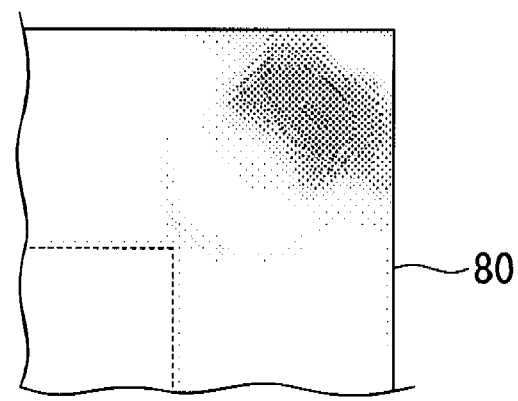
FIG. 16B is a plan view showing a thermal stress distribution of the pressure sensor package of FIG. 16A.

FIG. 16A shows a typical example of a pressure sensor package 80 according to an exemplary embodiment mounted on another substrate, namely, an external substrate 71. FIG. 16B shows the distribution of thermal stress around the bumps.

Figure 17A:
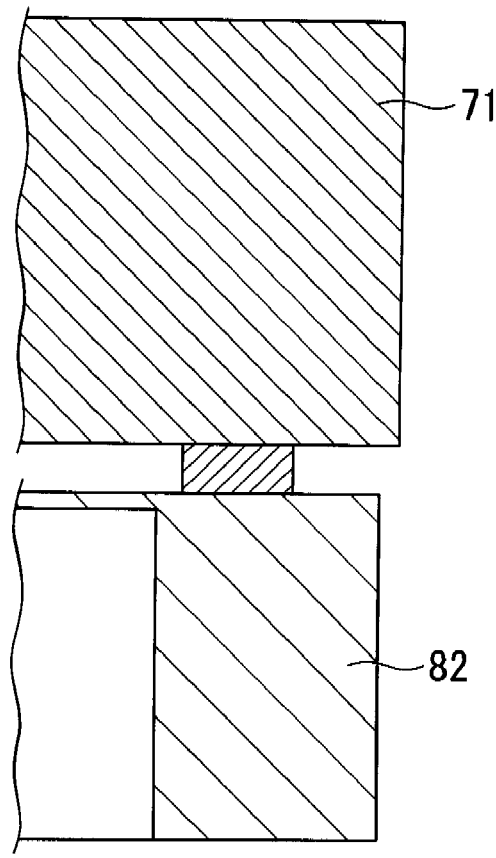
FIG. 17A is a side cross-sectional view of main part of a conventional pressure sensor package mounted on the external substrate.
Figure 17B:
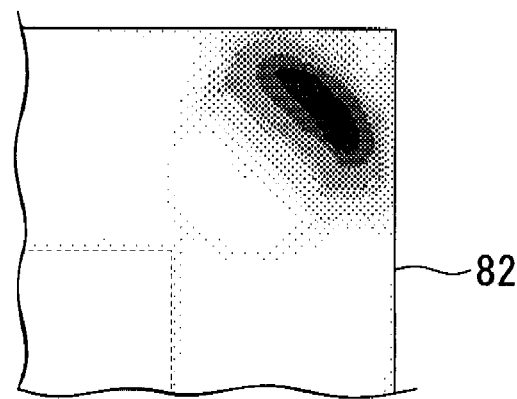
FIG. 17B is a plan view showing a thermal stress distribution of the pressure sensor package of FIG. 17A.

FIG. 17A shows a typical example of a pressure sensor package 82 according to an exemplary embodiment mounted on another substrate, namely, an external substrate 71. FIG. 17B shows the distribution of thermal stress around the bumps.

As a result of the comparison with reference to FIG. 16B and FIG. 17B, the structure (typical example) of the exemplary embodiments was by far superior to the conventional structure in terms of thermal stress. That is, the structure of the exemplary embodiments generated by far smaller amounts of thermal stress.

Next, referring to FIGS. 18A to 20, differences in operation and advantageous effects due to thickness (D1 or T1) of the substrate in the pressure sensor package according to exemplary embodiments will be described briefly.

Figure 18A:
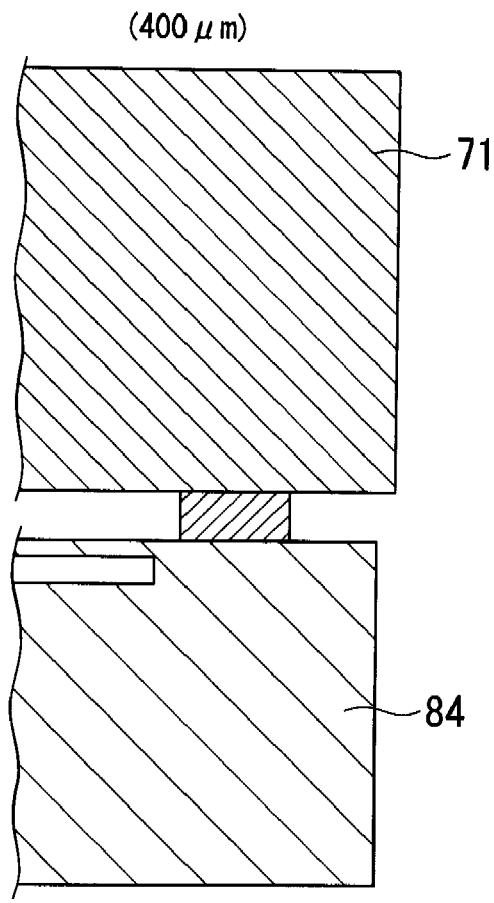
FIG. 18A is a side cross-sectional view of a main part of a thick-section example of the pressure sensor package according to an exemplary embodiment of the invention mounted on the external substrate.
Figure 19A:
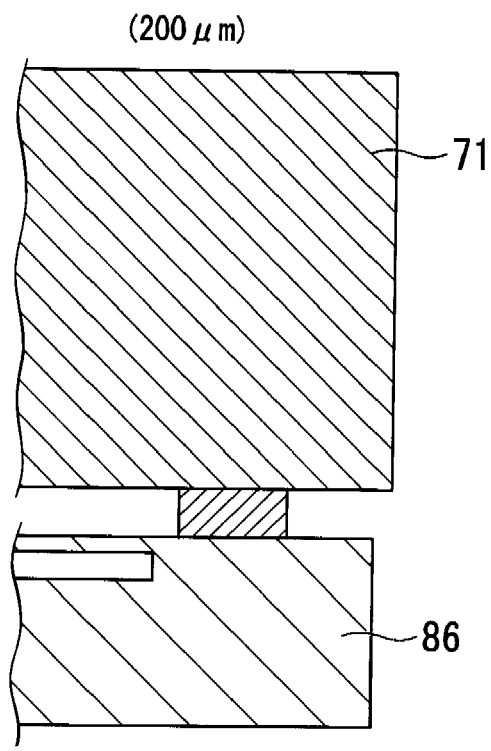
FIG. 19A is a side cross-sectional view of a main part of a medium-section example of the pressure sensor package according to an exemplary embodiment of the invention mounted on the external substrate.
Figure 20A:
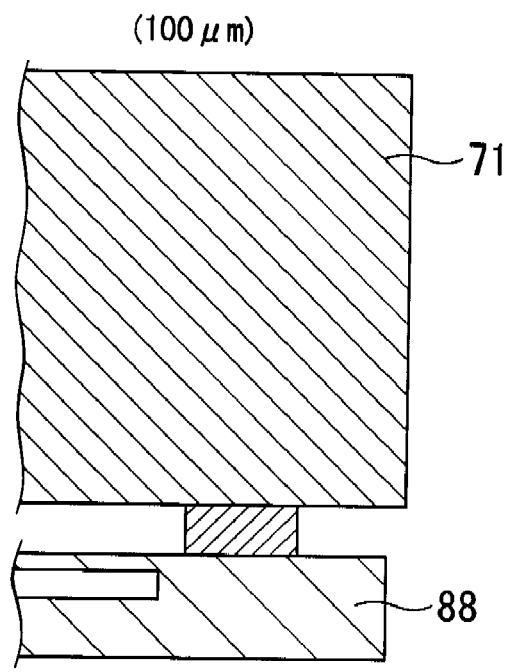
FIG. 20A is a side cross-sectional view of main part of a thin-section example of the pressure sensor package according to an exemplary embodiment of the invention mounted on the external substrate.

Pressure sensor packages having three different thicknesses were prepared and compared in a simulation (experiment). A thick-section (400 micrometers) example is shown in FIG. 18A, a medium-section (200 micrometers) example is shown in FIG. 19A, and a thin-section (100 micrometers) example is shown in FIG. 20A.

Figure 18B:
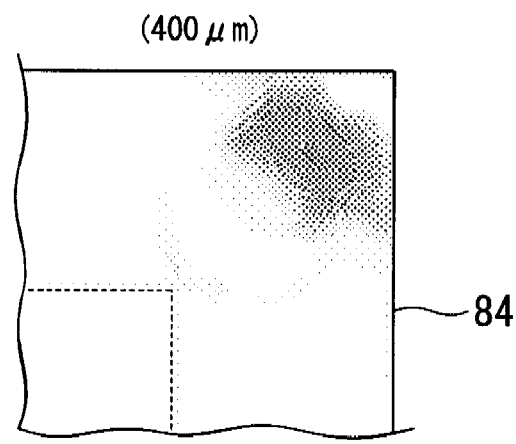
FIG. 18B is a plan view showing a thermal stress distribution of the thick-section example of the pressure sensor package of FIG. 18A.
Figure 19B:
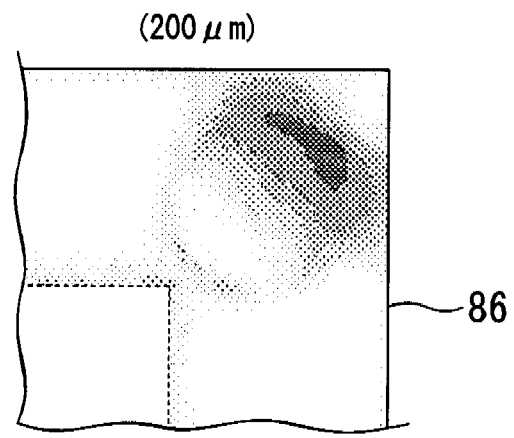
FIG. 19B is plan view showing a thermal stress distribution of the medium-section example of the pressure sensor package of FIG. 19A.
Figure 20B:
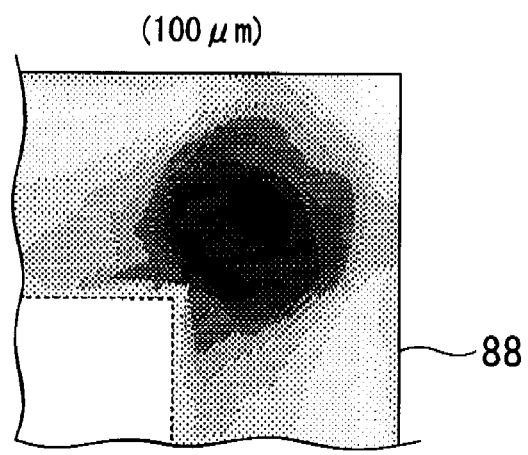
FIG. 20B is a plan view showing a thermal stress distribution of the thin-section example of the pressure sensor package of FIG. 20A.

FIGS. 18B, 19B and 20B each show the degree of distribution of thermal stress around the bumps of the mounted thick-section, medium-section, and thin-section examples, respectively.

As a result of a comparison, it was found that a satisfactory result could not be obtained with the thin-section example and that a certain thickness may be required to obtain satisfactory operation and advantageous effects.

Further experiment (heat reliability test) was conducted to find out the upper and lower limits of the optimum or practical substrate thickness. The condition was as follows.

Figure 21:
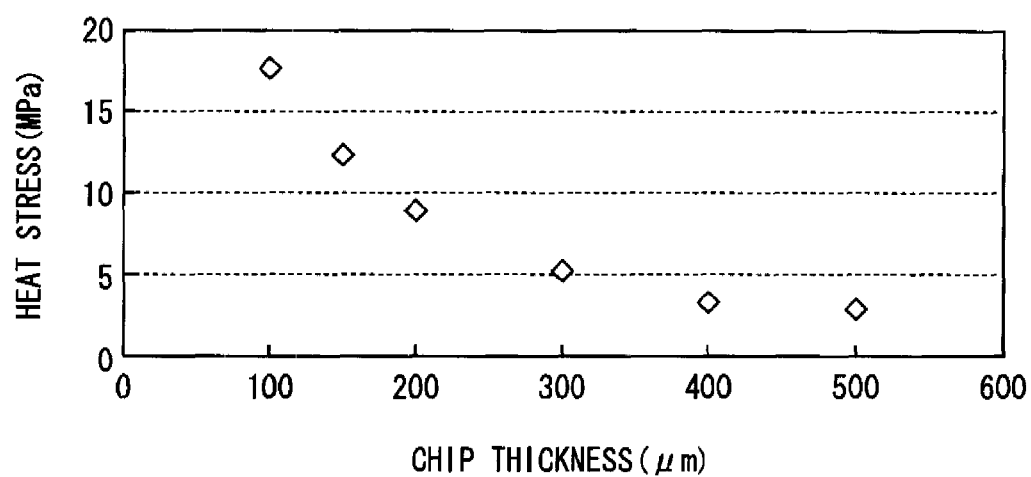
FIG. 21 shows a relationship between the thickness (chip thickness) of the substrate and the maximum value of the thermal stress inside the substrate.

−25/125 degree. C, 1000 cycles (the bumps were observed after 1000 cycles)

sensor dimension: D2: 5 micrometers; D3: 2 micrometers; D1: 100, 150, 200, 300, 400 and 500 micrometers external substrate 71: a rigid substrate (FR4) having thickness of 1 mm As a result of the experiment, no particular defect, such as crack in bumps, occurred in the substrate having a thickness of not less than 200 micrometers as understood from FIG. 21. However, in sensors having a thickness of 150 μm, defects were detected at a rate of three out of ten (3/10). In sensors having a thickness of 100 μm, defects were detected at a rate of five out of ten (5/10).

As a conclusion, the substrate thickness (D1 or T1) may be not less than 200 micrometers, and may have an upper limit (maximum thickness) of about 500 micrometers in terms of mounting property.

Note that, in the simulations (experiments) described above, the drawings which show the thermal stress distribution are plan views of the portion where the semiconductor package and the bumps are connected. In FIGS. 16B, 17B, 18B, 19B and 20B, a portion surrounded by a dotted line shows the diaphragm section. In the drawings, a thicker black portion indicates an area with a larger amount of stress.

INDUSTRIAL APPLICABILITY

A pressure sensor package according to embodiments of the invention is used for measuring pressure, for example, but not limited to, air pressure, water pressure and oil pressure. The pressure sensor package according to the invention is produced through wafer level chip-size packaging and thus requires no casing, and is suitable for various electronic parts to be made thin, compact and lightweight.

While the invention has been particularly shown and described with reference to exemplary embodiments thereof, the invention is not limited to the exemplary embodiments. It will be understood by those of ordinary skill in the art that various changes in form and details may be made therein without departing from the scope of the invention as defined by the following claims.

What is claimed is:

1. A pressure sensor package comprising:
   a pressure sensor comprising:
      a cavity disposed within a semiconductor substrate, wherein a region of the substrate above the cavity comprises a diaphragm section;
      a plurality of pressure-sensitive elements, wherein at least of portion of each pressure-sensitive element is disposed on the diaphragm section; and
      a plurality of conductive portions laterally spaced from the cavity and electrically connected to the pressure sensitive elements;
   a plurality of electrically conductive bumps arranged on the conductive portions and electrically connected to the conductive portions, wherein a total thickness D1 of the semiconductor substrate, a thickness D2 of the diaphragm section, a thickness D3 of the cavity, and a thickness D4=D1−(D2+D3) satisfy the relationships: (D2+D3) in a range of approximately 5-20 μm, and D1 not less than about 100 μm.

2. A pressure sensor package comprising:
a pressure sensor comprising:
   a cavity disposed within a semiconductor substrate wherein a region of the substrate above the cavity comprises a diaphragm section;
   a plurality of pressure-sensitive elements, wherein at least of portion of each pressure-sensitive element is disposed on the diaphragm section; and
   a plurality of first conductive portions laterally spaced from the cavity and electrically connected to the pressure sensitive elements;
a first insulating section covering a peripheral region of the semiconductor substrate;
a plurality of second conductive portions disposed on the first insulating section and electrically connected to the first conductive portions; and
a plurality of electrically conductive bumps disposed on the second conductive portions and electrically connected to the second conductive portions at positions not overlapping with the first conductive portions,
wherein a total thickness D1 of the semiconductor substrate, a thickness D2 of the diaphragm section, a thickness D3 of the cavity, and a thickness D4=D1−(D2+D3) satisfy the relationships: (D2+D3) in a range of approximately 5-20 μm, and D1 not less than about 100 μm.

3. The pressure sensor package according to claim 2, further comprising a second insulating section covering the peripheral region of the semiconductor substrate including the second conductive portions exposing only the electrically conductive bumps.

4. The pressure sensor package according to claim 2, further comprising a second insulating section overlapping with the first insulating section and covering the second conductive portions exposing only the electrically conductive bumps, wherein the second insulating sections form islands around the electrically conductive bumps and cover the second conductive portions.

5. The pressure sensor package according to claim 2, wherein adjacent electrically conductive bumps are symmetrically positioned with respect to one another.

6. The pressure sensor package according to claim 1, further comprising an amplifier circuit inside the semiconductor substrate.

7. The pressure sensor package according to claim 2, wherein the first insulating section has an island shape.

8. An electronic part including the pressure sensor package according to claim 1 mounted thereon.

9. The pressure sensor package according to claim 1, further comprising a compensating circuit inside the semiconductor substrate.

10. The pressure sensor package according to claim 2, further comprising an amplifier circuit inside the semiconductor substrate.

11. The pressure sensor package according to claim 2, further comprising a compensating circuit inside the semiconductor substrate.

12. An electronic part including the pressure sensor package according to claim 2 mounted thereon.

13. The pressure sensor package according to claim 1, wherein at least of portion of each pressure-sensitive element is disposed on a peripheral portion of the diaphragm section.

14. The pressure sensor package according to claim 2, wherein at least of portion of each pressure-sensitive element is disposed on a peripheral portion of the diaphragm section.

15. The pressure sensor package according to claim 1, wherein total thickness D1 of the semiconductor substrate is not less than about 200 μm.

16. The pressure sensor package according to claim 2, wherein total thickness D1 of the semiconductor substrate is not less than about 200 μm.

17. The pressure sensor package according to claim 1, wherein total thickness D1 of the semiconductor substrate is not greater than about 500 μm.

18. The pressure sensor package according to claim 2, wherein total thickness D1 of the semiconductor substrate is not greater than about 500 μm.

* * * * *